US008679576B2

(12) United States Patent
Nakai et al.

(10) Patent No.: US 8,679,576 B2
(45) Date of Patent: Mar. 25, 2014

(54) PLATING APPARATUS AND METHOD OF PLATING

(75) Inventors: Toru Nakai, Gifu (JP); Satoru Kawai, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 569 days.

(21) Appl. No.: 12/186,919

(22) Filed: Aug. 6, 2008

(65) Prior Publication Data

US 2009/0029037 A1    Jan. 29, 2009

Related U.S. Application Data

(63) Continuation of application No. PCT/JP2007/053096, filed on Feb. 20, 2007.

(30) Foreign Application Priority Data

Feb. 22, 2006    (JP) .................................. 2006-045358

(51) Int. Cl.
*B05D 1/12*    (2006.01)

(52) U.S. Cl.
USPC ........... 427/97.7; 427/356; 427/357; 427/367

(58) Field of Classification Search
USPC ................. 427/97.7, 356, 357, 367
See application file for complete search history.

(56) References Cited

U.S. PATENT DOCUMENTS

| 4,073,699 | A | 2/1978 | Hutkin |
| 4,964,948 | A | 10/1990 | Reed |
| 5,229,549 | A | 7/1993 | Yamakawa et al. |
| 5,278,385 | A | 1/1994 | Gerome et al. |
| 5,440,075 | A | 8/1995 | Kawakita et al. |
| 5,827,604 | A | 10/1998 | Unto et al. |
| 6,294,060 | B1 | 9/2001 | Webb et al. |
| 6,375,823 | B1 | 4/2002 | Matsuda et al. |
| 6,534,116 | B2 | 3/2003 | Basol |
| 6,607,652 | B2 | 8/2003 | Webb et al. |
| 6,802,761 | B1 | 10/2004 | Beaucage et al. |
| 6,863,209 | B2 | 3/2005 | Rinne et al. |
| 7,160,428 | B2 | 1/2007 | Fujimoto |
| 7,163,613 | B2 | 1/2007 | Hashimoto |

(Continued)

FOREIGN PATENT DOCUMENTS

| JP | 57-57896 A | 4/1982 |
| JP | 58-6999 A | 1/1983 |

(Continued)

OTHER PUBLICATIONS

Office Action issued Nov. 16, 2010 in the United States with U.S. Appl. No. 12/342,772 dated Dec. 23, 2008.

*Primary Examiner* — Michael Cleveland
*Assistant Examiner* — Austin Murata
(74) *Attorney, Agent, or Firm* — Oblon, Spivak, McClelland, Maier & Neustadt, L.L.P.

(57) ABSTRACT

A plating apparatus and method to perform plating in non-through-hole openings or through-hole openings of a printed wiring board having at least either non-through holes or through-holes to form via-hole conductors or through-hole conductors. The plating method contacts a printed wiring board having the non-through holes or through-holes with a plating solution including plating ingredients, and plates metal on a surface of the printed wiring board while making contact with at least a portion of a pliable contact body.

14 Claims, 19 Drawing Sheets

(56) References Cited

U.S. PATENT DOCUMENTS

| | | |
|---|---|---|
| 7,238,092 B2 | 7/2007 | Basol et al. |
| 7,481,909 B2 | 1/2009 | Nakai et al. |
| 2002/0020620 A1* | 2/2002 | Webb et al. .................. 204/198 |
| 2002/0096435 A1 | 7/2002 | Matsuda et al. |
| 2003/0064669 A1 | 4/2003 | Basol et al. |
| 2004/0185753 A1* | 9/2004 | Beaucage et al. ............... 451/28 |
| 2004/0245111 A1 | 12/2004 | Fujimoto |
| 2005/0211560 A1 | 9/2005 | Matsuda et al. |
| 2006/0024430 A1* | 2/2006 | Yau et al. ..................... 427/97.9 |
| 2006/0065534 A1 | 3/2006 | Nakai et al. |

FOREIGN PATENT DOCUMENTS

| | | |
|---|---|---|
| JP | 63-270497 A | 11/1988 |
| JP | 63-297588 A | 12/1988 |
| JP | 5-230691 A | 9/1993 |
| JP | 6-146066 A | 5/1994 |
| JP | 7-180092 A | 7/1995 |
| JP | 8-144086 A | 6/1996 |
| JP | 9-130050 A | 5/1997 |
| JP | 2000-232078 A | 8/2000 |
| JP | 2000-239892 A | 9/2000 |
| JP | 2002-47594 A | 2/2002 |
| JP | 2003-183883 A | 7/2003 |
| JP | 2004-225119 A | 8/2004 |
| JP | 2005-113173 A | 4/2005 |
| JP | 2005-511888 A | 4/2005 |
| JP | 2005-520044 A | 7/2005 |
| TW | 559922 | 11/2003 |
| WO | WO 03/009361 | 1/2003 |
| WO | WO 03/028048 | 4/2003 |
| WO | WO 2006/033315 | 3/2006 |

* cited by examiner

Fig. 4
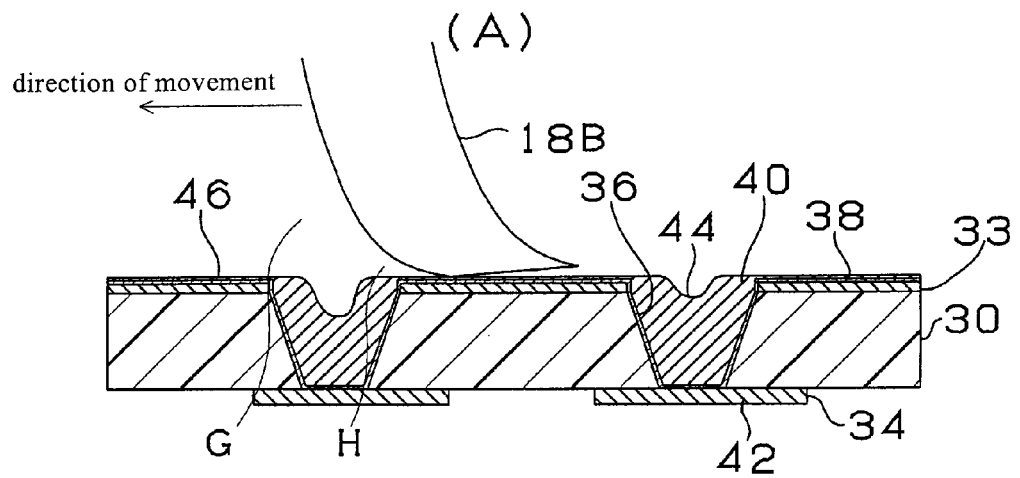
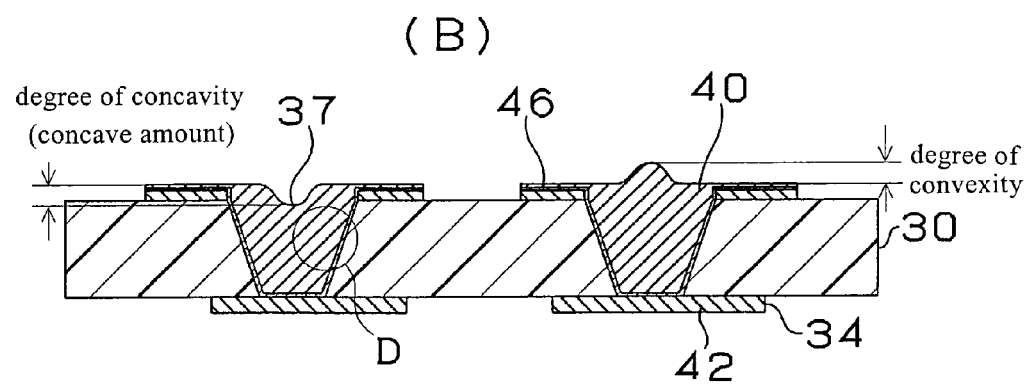
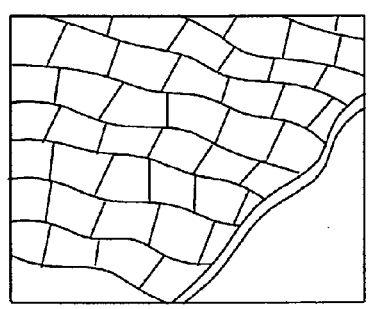

1. contact plating

|  |  | interlayer thickness (μm) | | | |
|---|---|---|---|---|---|
|  |  | 30 | 45 | 60 | 90 |
| via dia. (μm) | 40 | 5／-3 | 7／-5 | 10／-7 | 15／-2 |
|  | 60 | 5／-5 | 8／-3 | 12／+7 | 15／+2 |
|  | 80 | 6／-1 | 8／+2 | 12／+2 | 16／-5 |
|  | 120 | 6／-2 | 8／-1 | 13／+1 | 18／-5 |

(B)

2. conventional art 1 (without contact body)

|  |  | interlayer thickness (μm) | | | |
|---|---|---|---|---|---|
|  |  | 30 | 45 | 60 | 90 |
| via dia. (μm) | 40 | 12／+2 | 18／-5 | 25／-3 | 35／-3 |
|  | 60 | 12／-5 | 17／-7 | 24／+7 | 32／-1 |
|  | 80 | 15／-1 | 20／+3 | 25／-7 | 33／-5 |
|  | 120 |  |  |  | 35／-3 |

Fig. 14

Reference Example 1: contact body is non-pliable (glass).

via-hole diameter: 60 μm, interlayer thickness: 60 μm

|  | Experimental Example 1 | Reference Example 1 |
|---|---|---|
| ratio of change in resistance values | ○ | × |

Fig. 15

5. thickness of conductor required to limit the degree of concavity or convexity in via hole to within ±7 μm

| interlayer thickness | 30 | | 45 | | 60 | | 90 | |
|---|---|---|---|---|---|---|---|---|
| with contact body | 5 | 6 | 7 | 8 | 8 | 10 | 12 | 12 | 15 | 15 | 16 |
| without contact body | 12 | 15 | 18 | 17 | 20 | 25 | 24 | 25 | 35 | 32 | 33 |

Fig. 17
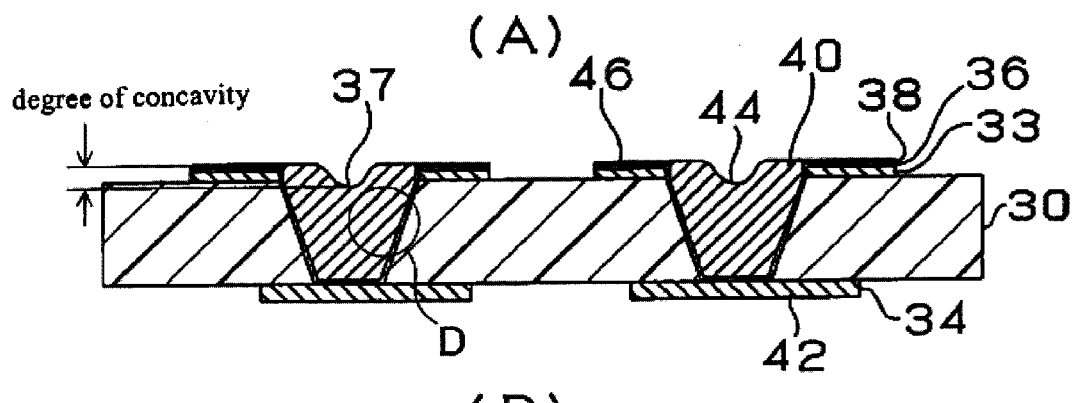
(A)
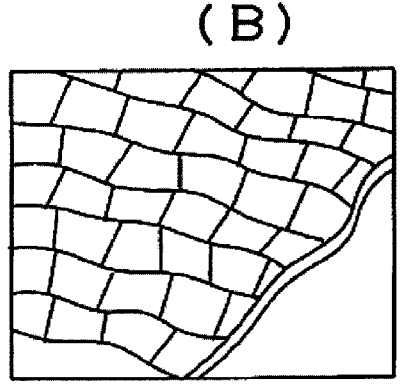
(B)
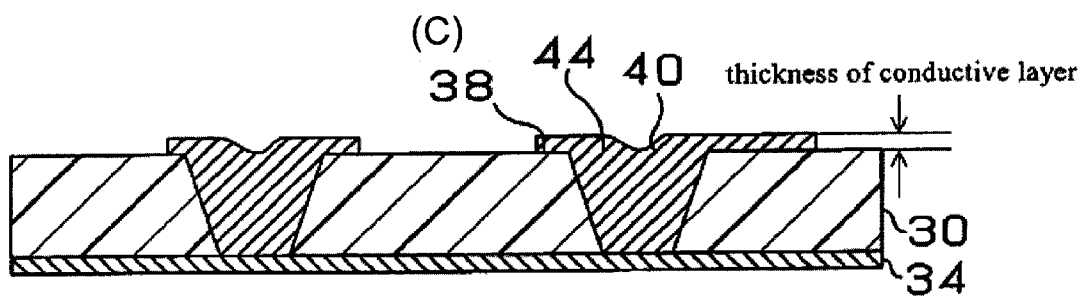
(C)

Fig. 18
(A)
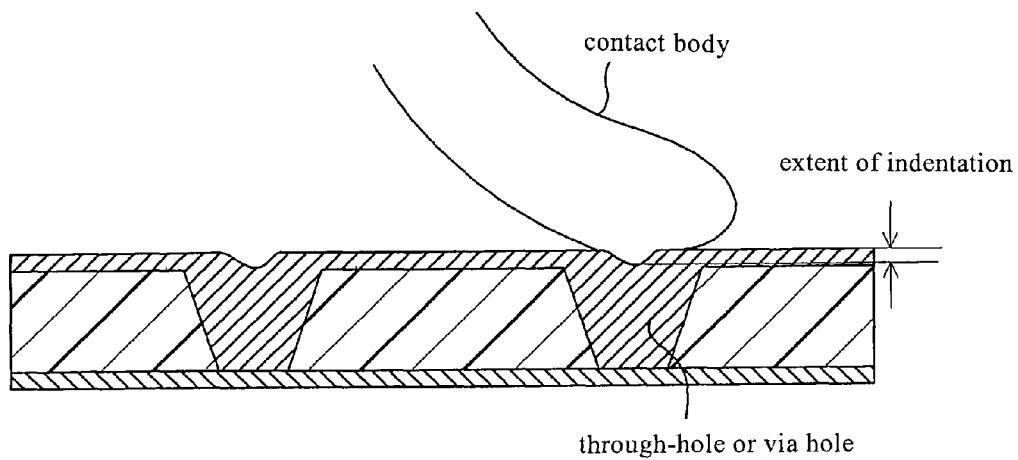
(B)
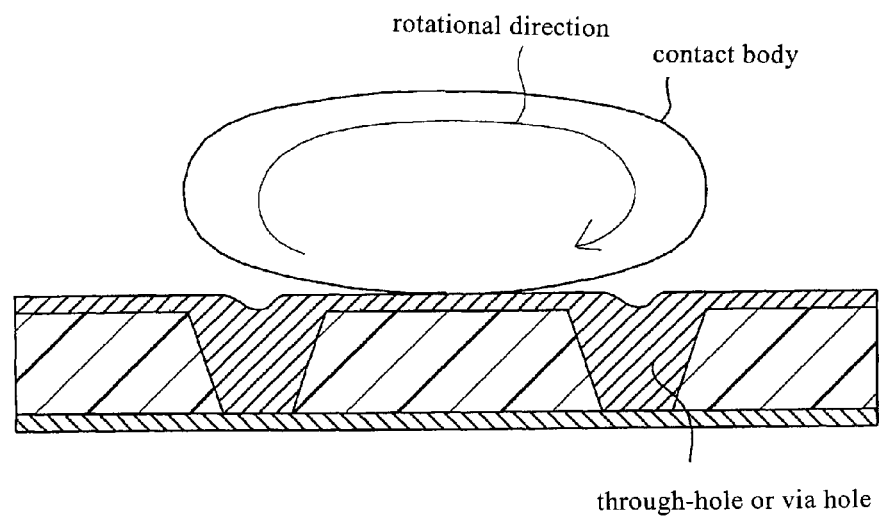

PLATING APPARATUS AND METHOD OF PLATING

CROSS REFERENCE TO RELATED APPLICATIONS

This application is based upon and claims the benefit of priority under 35 U.S.C. § 119(a) to Japanese Laid-Open Patent Application 2006-045358 filed Feb. 22, 2006. This application is a continuation application of, and is based upon and claims the benefit of priority under 35 U.S.C. §365(c) to PCT/JP2007/053096 filed Feb. 20, 2007. The entire contents of these applications are incorporated herein by reference.

BACKGROUND OF THE INVENTION

1. Field of the Invention

The present invention relates to a method of plating to conduct through-hole plating and via-hole plating so as to achieve uniform plated films and filling performance when plating the interiors of non-through-holes and through-holes.

2. Description of the Related Art Japanese Laid-Open Patent Application 2000-239892 describes a plating apparatus having a plating tank, an advancing device to advance a belt substrate into the plating tank, a bottom turning device formed in the plating tank to turn the descending continuous belt upward, a descending plating zone to plate the continuous belt descending toward the bottom turning device, a non-plating zone to pass the belt substrate ascending from the turning device without applying plating, and a pulling device to pull the belt substrate out of the plating tank right after it passes through the non-plating zone. Japanese Laid-Open Patent Application 2000-232078 discloses a plating method to plate non-through-holes on a surface of a silicon substrate by making contact with a contact pad made of polyvinyl alcohol. Japanese Laid-Open Patent Application 2004-225119 discloses a plating method to plate non-through-holes on a surface of a silicon substrate by making contact with a contact body having microscopic holes.

SUMMARY OF THE INVENTION

The present invention is to provide a method of plating and a plating apparatus for producing plated conductors having a prescribed surface roughness, when forming filled vias and through-hole conductors.

In one embodiment of the invention, there is provided a plating apparatus to perform plating in non-through-hole openings or through-hole openings of a printed wiring board having at least either non-through holes or through-holes to form via-hole conductors or through-hole conductors. The apparatus includes a plating tank including a plating solution and a pliable contact body, at least a portion of the plating solution makes contact with the surface of a printed wiring board.

In one embodiment of the invention, there is provided a method to perform plating in non-through-hole openings or through-hole openings of a printed wiring board having at least either non-through holes or through-holes to form via-hole conductors or through-hole conductors. The method contacts a printed wiring board having non-through holes or through-holes with a plating solution including plating ingredients, and performs plating on a surface of the printed wiring board while making contact with at least a portion of a pliable contact body.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4A and 4B are views illustrating manufacturing of filled vias using the plating apparatus according to Example 1;

FIG. 4C is an enlarged view illustrating the portion indicated as circle "D" in FIG. 4B;

FIG. 13 are tables showing the results of the evaluation tests in the examples and comparative examples;

FIG. 14 is a table showing the results of the evaluation tests in Experimental Example 1 and Reference Example 1;

FIG. 15 is a table showing the thickness of conductors required to make the degree of concavity or convexity ±7 or less;

FIG. 17A is a cross-sectional view of a flexible printed wiring board manufactured without using the plating apparatus according to Example 1;

FIG. 17B is an enlarged view of the portion shown by circle "D" in FIG. 17A;

FIG. 17C is a view illustrating a via hole to be used in the test;

FIG. 18A is a view illustrating the extent of indentation by a contact body;

FIG. 18B is a view illustrating the rotational motion of a contact body; and

DETAILED DESCRIPTION OF THE EMBODIMENTS

Figure 1:
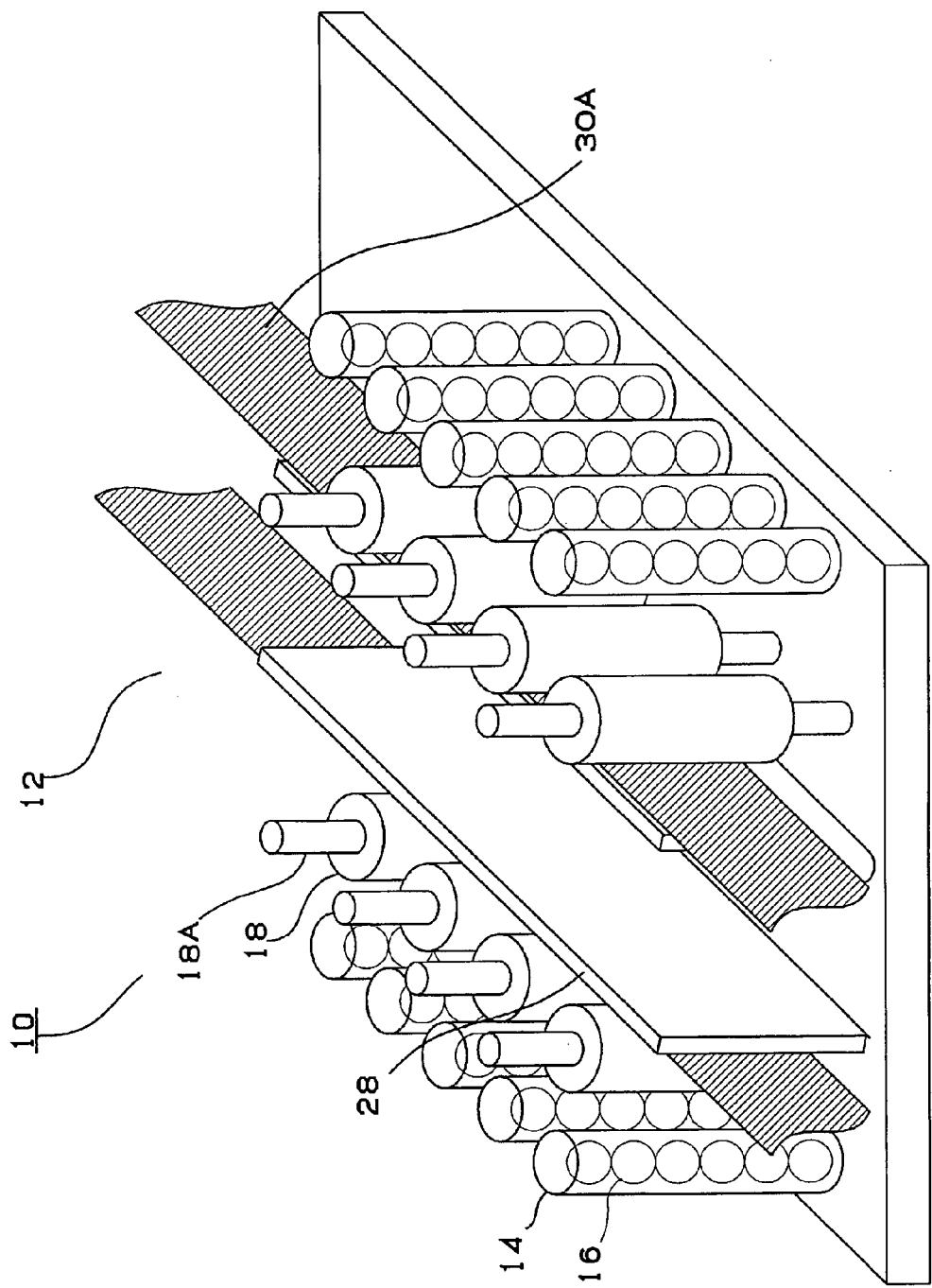
FIG. 1 is a view illustrating an entire structure of a conveyor mechanism in a plating tank.

The present invention relates to a plating apparatus and a method of plating to perform plating while keeping at least a portion of a contact body, that portion having pliability at least on its surface, in contact with a plating surface of a printed wiring board or a belt substrate.

The inventors have discovered that, when plating with a belt substrate, higher current density is desired to raise the productivity without increasing the number of plating tanks or the length of plating tanks. Accordingly, when trying to form filled vias in a product, deep cavity 37 in the center of via hole 44, as shown in FIG. 17A, may be formed, or to the contrary, convex portions may be formed.

As shown in Japanese Laid-Open Patent Application 2000-232078 and Japanese Laid-Open Patent Application 2004-225119, one can optionally make surfaces of via holes flat and smooth by keeping an insulator in contact with a plating surface while plating. However, Japanese Laid-Open Patent Application 2000-232078 and Japanese Laid-Open Patent Application 2004-225119 relate to manufacturing technologies for semiconductors and thus are intended to form wirings on a silicon substrate having highly flat and smooth surfaces. Therefore, if such technologies were applied on printed wiring board 30 having uneven surfaces, as shown in FIG. 17C, a flat circuit would be formed. At conductive circuit 46, thin portions E and thick portions F are formed, and when a thermo-stress is exerted, wiring may rupture easily at the thin portions. In addition, impedance consistency is lowered and electric characteristics are degraded. Also, via-hole diameters are in the range of 15-400 nm in semiconductors, but have viable limits of 10 μm or larger in printed wiring boards. Since the diameters in a printed wiring board are 100-1,000 times as large as those in semiconductors, filling performance may easily deteriorate.

However, in the present invention, since the contact body is pliable, even if a printed wiring board is undulated or uneven, the contact body makes flexible movements to accommodate such an undulated or uneven surface, thereby improving filling performance. Thus, a plated film having a uniform thickness can be easily formed on a surface of the printed wiring board. Also, since the contact body bends, a force exerted in the direction of a cross-sectional surface of the substrate (the direction going into the interiors of via holes or through-holes) may weaken. Thus, the contact body may seldom enter the interiors of via-holes and through-holes. Here, as for the contact body, it is preferred to use a contact body which enters via-holes and through-holes with an extent of indentation X, shown in FIG. 18A, of 10 μm or less.

As in the present invention, since a pliable contact body makes direct contact with a surface of a printed wiring board, compared with conventional mixing methods such as bubbling or splashing plating solution onto the board, the diffusion layer, the region having less plating ingredients or a thinner concentration of additives, can be made thinner. Therefore, on the plating surface, excluding the interiors of via holes (i.e., in concave portions) or the interiors of through-holes, an inhibitive agent (e.g. a suppression agent) contained in the plating solution ingredients can adhere more easily than in conventional mixing methods. In contrast, since the interiors of via holes (concave portions) and the interiors of through-holes have diffusion layers whose thickness is in proportion to the depth of via holes (i.e. in the concave portions) and through-holes, similar to conventional mixing methods, an inhibitive agent seldom adheres there. Therefore, on the interiors of via holes (concave portions) and the interiors of through-holes, the growth speed of plated films is higher than in other portions. Also, excluding the interiors of via holes and the interiors of through-holes, plating is seldom extracted onto the plating surface. Accordingly, on the areas excluding the interiors of via holes (concave portions) and the interiors of through-holes, less of the main plating ingredient (e.g. copper for copper plating; nickel for nickel plating, etc.) is consumed. Thus, the supply of the main plating ingredient for the interiors of via holes (concave portions) and the interiors of through-holes increases. Accordingly, on the interiors of via holes (concave portions) and the interiors of through-holes, the growth speed of plated films itself will be accelerated.

Referring now to the drawings, wherein like reference numerals designate identical or corresponding parts throughout the several views, as shown in FIG. 4A, since contact body 18 is pliable, the degree at which it warps automatically changes as plated layer 40 thickens. Also, as shown by H in FIG. 4A, since contact body 18 moves along while keeping the plating solution directly in front of contact body 18, the plating solution can be supplied freshly on the surface of the printed wiring board. In addition, as shown by G in FIG. 4A, contact body 18 warps at its front portion when moving. Thus, the flow of plating solution toward the printed wiring board can be easily stimulated. Accordingly, the surface of the printed wiring board, including the interiors of via holes and through-holes, can be provided with a fresh plating solution. Thus, with a fresh supply of a plating solution to the surface of the substrate, it is possible to increase the current density, and the plating growth speed can be accelerated accordingly.

As for the material of the contact body, any material is sufficient as long as it has tolerance to plating solutions (i.e. tolerance to acid, especially tolerance to a copper sulfate plating solution, etc.), pliability, and bendability. For example, polyvinylidene chloride resin, polyvinyl alcohol, vinyl acetate, polyethylene, polypropylene, nylon, fluoride resin, or vinyl chloride resin can be used for the contact body.

Such resins can be made into fiber and bundled to form a brush-type contact body. The width of the fiber on the contact body is preferred to be larger than the diameter of through-holes and via holes to prevent the fiber from entering the holes. By mixing bubbles into the fiber or adding rubber or the like, the fiber's bendability can be adjusted. Also, the above resins can be made into a board to form a spatula-like shape to make contact with a printed wiring board. Further, as shown in FIG. 18B, a pliable contact body can rotate along the substrate. If the contact body is formed like a brush, since the plating solution can pass through fibers, current density can be increased.

EXAMPLE 1

Figure 2:
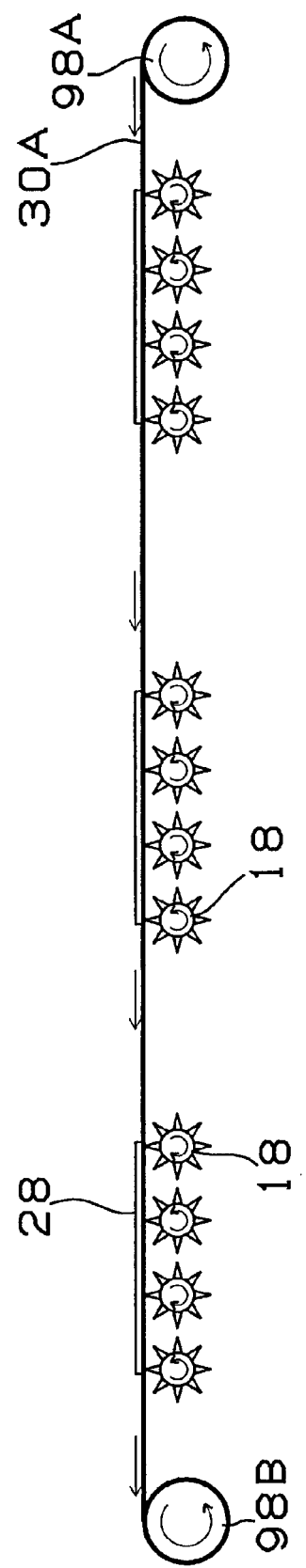
FIG. 2 is a view illustrating one side of a structure of a conveyor mechanism in a plating tank.

The structure of a plating apparatus according to Example 1 of the present invention is described in reference to FIGS. 1-2. FIG. 1 is a view illustrating the entire structure of a plating apparatus according to Example 1. FIG. 2 is a view illustrating a conveyor mechanism at one side of a plating tank. Plating apparatus 10 performs plating, for example, on a belt substrate to be used in a flexible printed wiring board. On one side of belt substrate 30A pulled out of reel 98A on which a belt substrate 180 millimeters wide and 120 meters long is wound, electrolytic plating is performed. Then, the belt substrate is rewound on take-up reel 98B. Plating apparatus 10 has contact body 18, which is in an insulative cylindrical shape, and in contact with a plating surface of belt substrate 30A; back board 28, which prevents belt substrate 30A from warping while touching contact body 18; and anodes 14, which supply power to the plating solution. Inside anodes 14, copper balls to replenish the copper ingredient to the plating solution are stored. As shown in FIG. 2, in plating tank 12, a plating line of a total length, for example, of 20 meters is structured. Instead of using an insulative contact body, a semiconductor contact body can be used.

In one embodiment, contact body 18 is a cylindrical brush made from PVC (polyvinyl chloride), 200 mm high and 100 mm in diameter. At contact body 18, the tip of the brush comes in contact with the printed wiring board and bends. Contact body 18 is supported by support pole 18A made, for example, of stainless steel, and is rotated by a gear which is not shown. Contact bodies 18 are arranged next to each other in the direction to which belt substrate 30A is conveyed, and rotated in different directions from each other. This is because if the rotational direction is the same, a conveyor force in the direction of the rotation will be exerted on belt substrate 30A, and thus excess tension will be added. In Example 1, since the rotational direction is different, the conveyor forces exerted on belt substrate 30A are offset by each other, thus excess tension will not be added. Here, the direction in which each contact body 18 is rotated is shown by arrows in FIG. 2. In Example 1, the rotation axis of contact body 18 is set to be perpendicular to the direction in which belt substrate 30A is conveyed. However, contact bodies 18 can be arranged in such a way that the rotation axis is set to be oblique or parallel instead of perpendicular.

With reference to FIGS. 3A-3D, formation of filled vias and conductive circuits using plating apparatus 10 is described. FIG. 3A shows a double-sided copper-clad flexible substrate. In this example, a commercially available dry film is laminated on one side of the substrate, and portions of copper foil 33 corresponding to where via-holes 36 are positioned are removed by etching using, for example, a conventional method. Using copper foil 33 as a mask, via holes 36 can be formed in this example by a carbon dioxide laser (see FIG. 3B). Then, on the surfaces of copper foil 33 and via holes 36, chemical copper plating 38 is performed (FIG. 3C). After that, using plating apparatus 10 as shown in FIG. 1, an electrolytic plated film 40 is formed (FIG. 3D). In this case, a portion of the contact body makes contact with at least a portion of the surface of the printed wiring board while performing plating. At the start of electrical plating, contact body 18 is in contact with chemical copper-plated film 38, and once an electrolytic plated film is formed, it will come in contact with the electrolytic plated film.

According to the plating apparatus and the method of plating in Example 1, as shown in FIG. 4A, on the interiors of via holes or through-holes, plated film 40 and the tip of brush hair 18B of contact body 18 do not easily make contact with each other. Once a plated film is formed on the interiors, the height difference between the other conductive portion and the plated film is reduced. When the height difference decreases, the plated film can be easily touched by the brush (which forms part of the contact body). Thus, the growth of the plated film is suppressed or halted. As a result, the height of via holes (or through-holes) and of the conductive circuit can be made uniform. Accordingly, as shown in FIG. 4B, filled vias 44 with a smaller degree of concavity or convexity (e.g., 7 μm or less) can be produced.

Also, while the plating in via-hole and through-hole openings grows, the thickness of conductive circuit 46 and the conductive portion, excluding the via-holes, will be suppressed due to their contact with the contact body. Namely, while the plating inside the via-holes is securely formed, the other portions of conductive circuit 46 can be formed as a relatively thinly plated film, compared with the thickness of the via-holes, or with the conductive circuit portion formed by the plating method of a conventional art (Japanese Laid-Open Patent Application 2000-239892). Accordingly, a conductive circuit that is even more highly integrated than conventional ones can be formed. Especially, when a conductive circuit is formed on the entire surface, and the conductive circuit is formed by etching (e.g., a subtractive method or a tenting method), it can be formed with a fine pitch, thus making it advantageous to become highly integrated.

In Example 1, the contact body makes contact with a moving plating surface (i.e., the surface of the belt substrate). Therefore, unlike conventional mixing methods such as bubbling, shaking, or splashing a liquid flow against the plating surface, the diffusion layer (i.e., the region where the concentration of the main plating ingredient and additives becomes thinner toward the plating surface) formed near the plating surface can be made thin. Accordingly, an additive (e.g., a suppression ingredient) in the plating solution which suppresses the plating growth tends to adhere more onto the portion excluding the via holes (i.e., the plating surface on the substrate). In contrast, the suppression ingredient seldom sticks to the interiors of via holes due to their depth (the ratio of the amount of suppression ingredient on the plating surface of the substrate to the amount of suppression ingredient on the plating surface inside the via holes is large compared with conventional art). As a result, the ratio of the plating growth speed inside via holes to the plating growth speed at portions excluding the via holes becomes large. Also, since the plating ingredient (for example, the copper ingredient in copper plating) is consumed less at the portions excluding the via holes, the consumption of the plating ingredient inside the via holes is given priority. Thus, the plating growth speed inside via holes accelerates. Therefore, as compared to conventional art, according to Example 1, while the plating on the substrate surface is formed more thinly, plated film 40 inside the via holes is efficiently formed. In the same manner, plated conductors can also be filled in the through-holes while the plating on the substrate surface is formed more thinly than conventional art.

Also, by moving or rotating the contact body along the plating surface, or by rotating the contact body while moving, the flow of the plating solution can be set in one direction. Especially, the flow around via holes can be set in a direction with a constant supply of the solution. Accordingly, the variation of the plating formation around via holes can be reduced. Thus, when forming via holes, the degree of concavity is decreased, and when forming through-holes, varied shapes around the through-hole shoulders on the surface are avoided.

According to this example, under certain conditions, such as a certain kind of contact body, rotation conditions of the contact body and moving conditions, the composition of a plating solution, etc., the plating solution is supplied for via holes or through-holes being formed. Accordingly, since the plating solution is forced to be provided for via holes or through-holes, the opportunity for the solution to make contact with the plating surface increases, thus accelerating the growth of the plated film. In other words, a contact body or the like will not cause an irregular liquid flow near via holes or through-holes. Accordingly, the interior crystalline structure of the plated film is more in alignment. Compared with conventional methods, interior resistance inside the plated film can be reduced. Thus, the electrical connectability is enhanced, and when reliability testing such as high-temperature and high-humidity testing or heat-cycle testing is conducted, reliability can be maintained longer than those by conventional methods. The same result is found in through-holes.

The motion speed and rotation speed (speed at the periphery) of the contact body are preferred to be set at 1.0-8.0 m/min. If the speed is slower than 1.0 m/min., the direction of liquid flow will not change, thus the result may end up the same as in the case without using a contact body. If the speed exceeds 8.0 m/min., the motion speed and rotation speed of the contact body are accelerated, and there may be occasions the direction of liquid flow cannot be changed. Accordingly, the results are inferior to those obtained when the contact body is moved and rotated. The motion speed and rotation speed are preferred to be set in the range of 3.0-7.0 m/min. If the speed is in that range, the direction of liquid flow can be changed even in a limited area.

The size of the contact body is preferred to be the same as or larger than the width of the plating area of the belt substrate. The extent of indentation to which the contact body pushes into the surface (the amount of further pushing into the surface from the point where the contact body makes contact with the surface of the printed wiring board) is preferred to be 1.0-15.0 mm from the surface of the printed wiring board. If the extent of indentation is less than 1.0 mm, the result may be the same as in the case without using a contact body. If the extent of indentation exceeds 15.0 mm, since the supply of the plating solution is blocked, it may cause varied plated films in via holes or through-holes. That is because the contact body can easily go into via holes or through-holes. The extent of indentation into the surface is preferred to be set at 2-8 mm so that the plated film seldom varies.

A contact body selected from either a pliable brush or spatula is preferred to be used. A contact body having pliable characteristics follows the uneven surface of the substrate. Thus, a plated film with a uniform thickness can be formed on the uneven surface.

A resin brush can be used as a contact body in the embodiment of the invention. In such a case, the tip of the brush makes contact with the plating surface. Here, the diameter of the brush is preferred to be made larger than the diameter of through-hole openings or via-hole openings. This is so that the tip of the brush will not enter the interiors of through-hole openings or via-hole openings and thus proper plated films can be filled inside the openings. As for the resin brush, resin brush materials having tolerance to plating solutions, such as PP (polypropylene), PVC (polyvinyl chloride), or PTFE (polytetrafluoroethylene), can be used. Resin or rubber can be used as well. In addition, resin fabric such as woven or non-woven fabric of polyvinyl chloride can be used for the brush tips.

FIG. 4C is a view illustrating an enlarged section of electrolytic plated film 40 shown by circle B in FIG. 4B. The inventors have found that the crystalline structure of plated copper is in alignment by using the plating apparatus according to Example 1. This is because the liquid flow around the via holes can be set in one direction by contact body 18.

Figure 3:
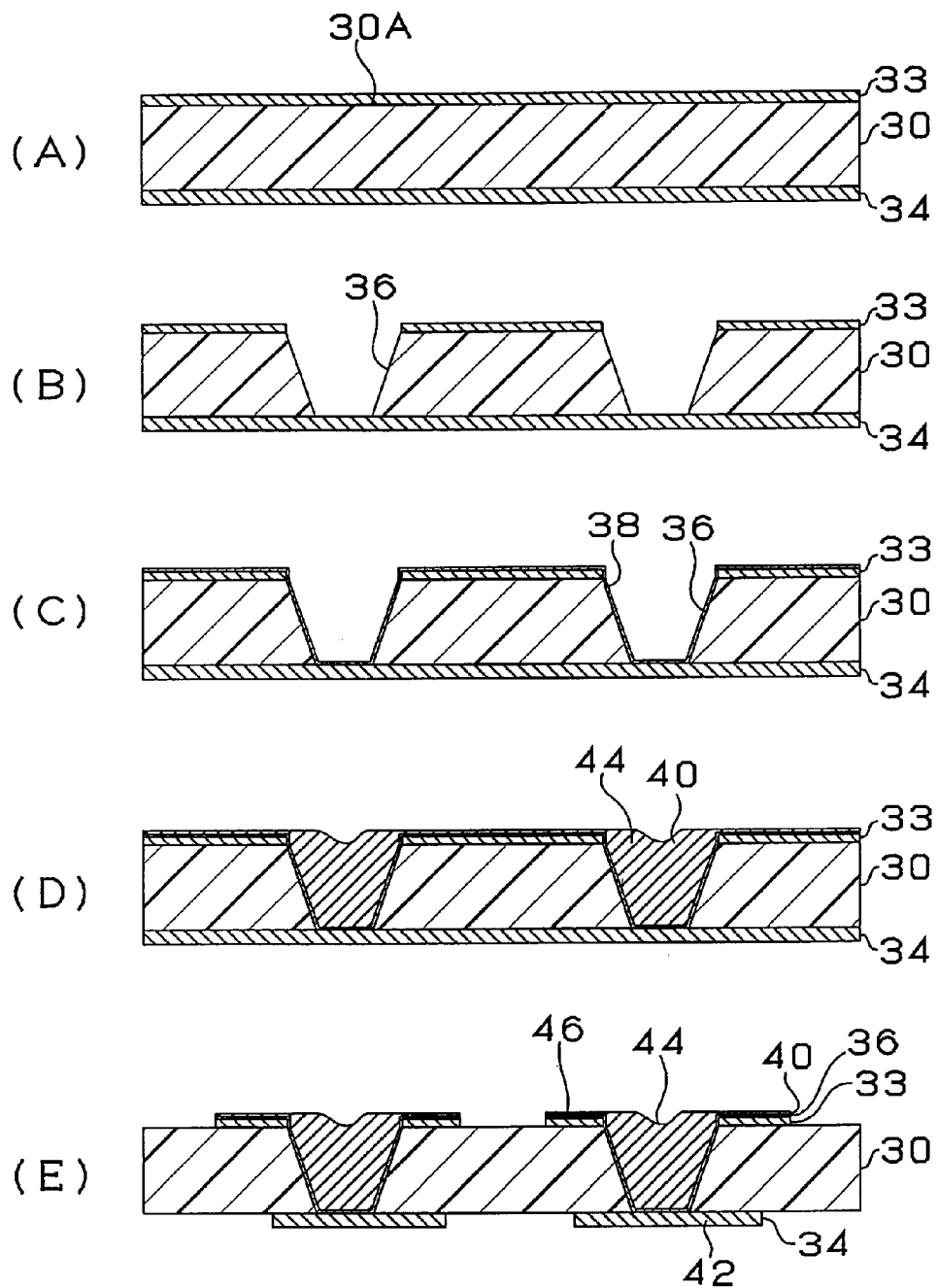
FIG. 3 are views illustrating manufacturing steps of a flexible printed wiring board using the plating apparatus according to Example 1.

FIG. 17B is a view illustrating an enlarged portion of a plated film in a filled via plated without using the plating apparatus according to Example 1=which corresponds to the circle D in FIG. 17A. Without using the plating apparatus according to Example 1, the crystalline structure of the copper was found not to be clearly in alignment. In the following, a manufacturing method (e.g., a subtractive method or tenting method) using the plating apparatus of Example 1 is described with reference to FIG. 3. Laminated belt substrate 30A was prepared as a starting material: On the top surface of 25 μm-thick polyimide belt substrate 30, 9 μm-thick copper foil 33 was laminated. On the back surface, a 12 μm-thick copper foil 34 was laminated (FIG. 3A). First, by light etching, the thickness of a 9 μm-thick copper foil 33 was adjusted to 7 μm. Next, by a laser, openings 36, which penetrate copper foil 33 and polyimide belt substrate 30 and reach the back surface of copper foil 34, were bored (FIG. 3B). Then, on the top surface of belt substrate 30A, by applying a palladium catalyst, catalytic nuclei were adhered (not shown in the drawing).

Next, in an electroless plating solution (e.g., Thrucup PEA made by C. Uyemura & Co., Ltd.), the substrate with adhered catalyst was immersed. On the plating surface of belt substrate 30A, 1.0 μm-thick chemical copper-plated film 38 was formed (FIG. 3C).

Then, belt substrate 30A was washed with 50° C. water to remove grease, washed with 25° C. water, and further washed with sulfuric acid. After that, using plating apparatus 10 described above with reference to FIG. 1, electrolytic plating was performed under the following conditions to form electrolytic plated film 40 (FIG. 3D).

| Electrolytic plating solution | |
| --- | --- |
| sulfuric acid | 2.24 mol/l |
| copper sulfate | 0.26 mol/l |
| additive | 19.5 ml/l |
| leveling agent | 50 mg/l |
| polishing agent | 50 mg/l |
| Electrolytic plating conditions | |
| current density | 5.0-30 mA/cm$^2$ |
| time | 10-90 minutes |
| temperature | 22 ± 2° C. |

Here, the current density is preferred to be set at 5.0-30 mA/cm$^2$, more preferably to be set at 10 mA/cm$^2$.

Here, as described above with reference to FIG. 1, by keeping contact body 18 in contact with the plating surface, electrolytic plated film 40 is formed, as the degree of concavity or convexity of via holes 36 is set in the range of 5-7 μm and the thickness on copper foil 33 was set at 4 μm. Namely, electrolytic plated film 40 is formed so that the thickness of the conductive circuit on copper foil 33 is made 12 μm, the same as that of copper foil 34, and filled vias 44 are formed at the openings. The speed of the contact body is set at 7 m/min., the conveyor speed for belt substrate 30A is set at 0.36 m/min., and the extent of indentation to which the contact body pushed into the surface is set to be 15 mm.

Then, a resist having a predetermined pattern is formed and etched to form conductive circuit 46 and conductive circuit 42 (FIG. 3E). This is retained here as a subtractive method or a tenting method.

EXAMPLE 2

In the following, a manufacturing method according to Example 2 is described with reference to FIGS. 5 and 6A-6F. In Example 1 described above with reference to FIG. 1, filled vias 44 are formed on one surface by plating apparatus 10. In contrast, in Example 2, plating is performed on both surfaces of laminated belt substrate 130 to form through-holes. Also, in Example 2, as for contact body 18, a cylinder brush made of, for example, PVC (polyvinyl chloride), the tip of which makes contact with the printed wiring board, is used.

Figure 5:
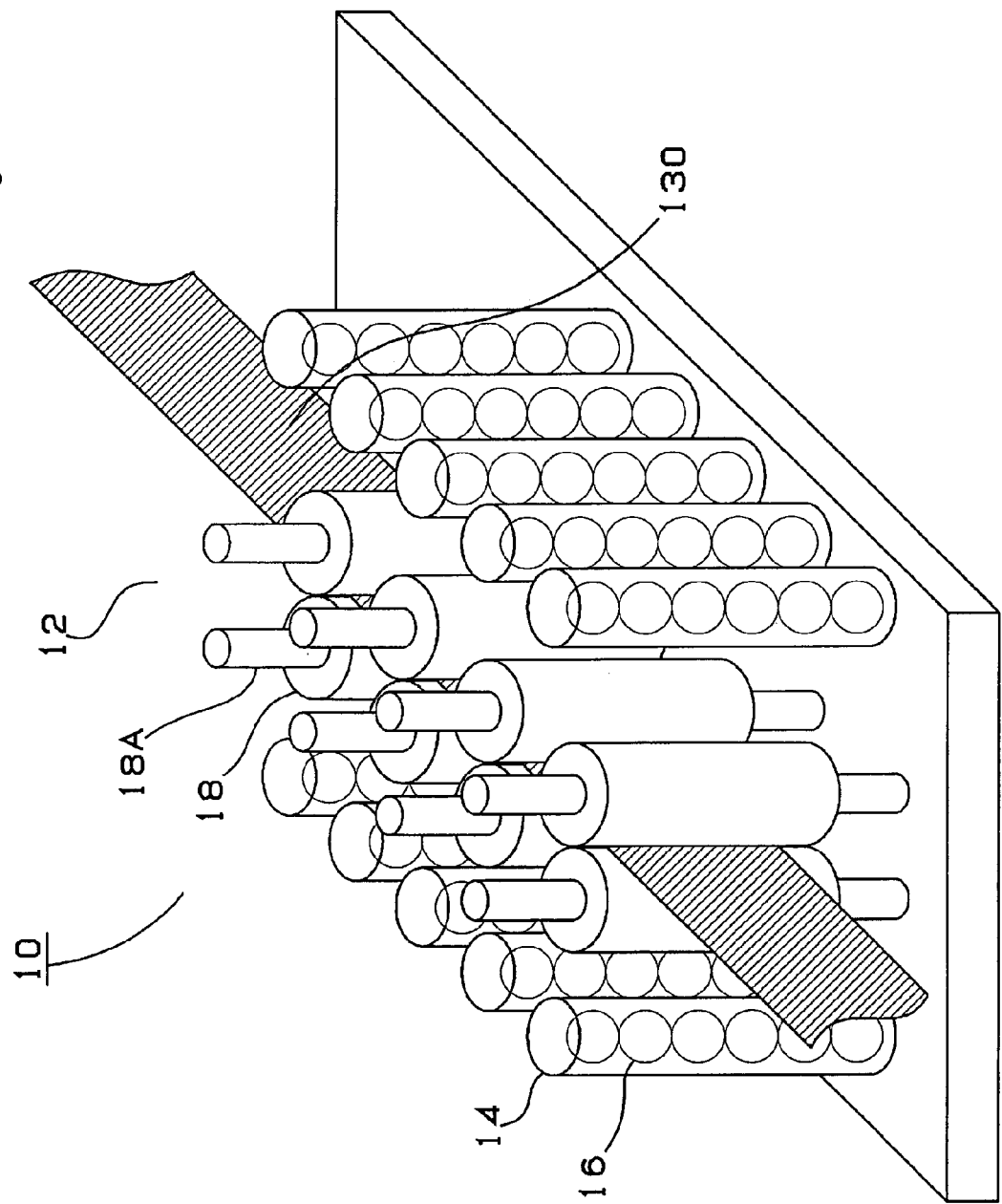
FIG. 5 is a perspective view of the conveyor mechanism in a plating tank of the plating apparatus according to Example 2.

FIG. 5 shows the structure of a plating tank of the plating apparatus according to Example 2. In Example 2, back board 28 is omitted and contact bodies facing each other are arranged so as to sandwich belt substrate 130.

Figure 6:
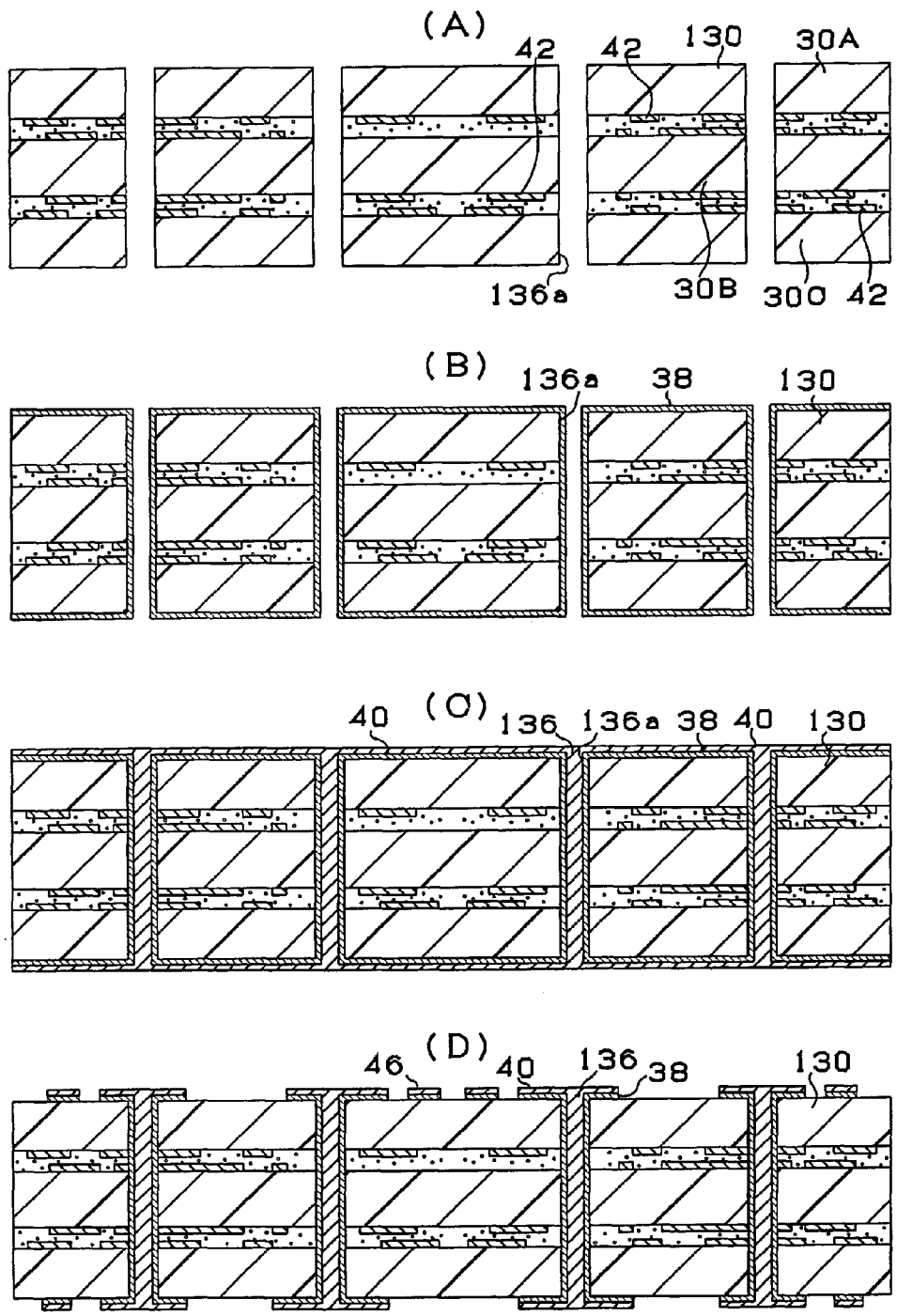
FIG. 6 are views illustrating the manufacturing steps of a flexible printed wiring board using the plating apparatus according to Example 2.

First, in laminated substrate 130 with belt substrates 30A, 30B, and 30C having conductive circuits 42, through-hole openings 136a are bored (FIG. 6A).

Next, on the entire surface of laminated substrate 130 and inside through-hole openings 136a, chemical copper plated films 38 are formed (FIG. 6B).

Using plating apparatus 10 of Example 2, described above with reference to FIG. 5, an electrolytic plated film 40 is formed on the surface of laminated substrate 130, while filling the interior of through-hole openings 136a with electrolytic plated film 40 (FIG. 6C).

After etching resist is formed, the electrolytic plated film 40 and chemical copper-plated film 38 in the area where the etching resist was not formed were removed by etching. Then, the etching resist is removed to form independent upper-layer conductive circuit 46 (including through-holes 136) (FIG. 6D). This is referred to here as a tenting method or subtractive method.

EXAMPLE 3

Regarding the plating apparatus in Example 1 described above with reference to FIG. 1, a contact body 18 is structured with a resin brush. In contrast, in Example 3, the contact body is structured with, for example, a spatula-shaped polyvinyl-chloride woven fabric. In Example 3, a plating resist is formed, and then plating layers are formed. The manufacturing steps are described with reference to FIGS. 7A-7E.

Figure 7:
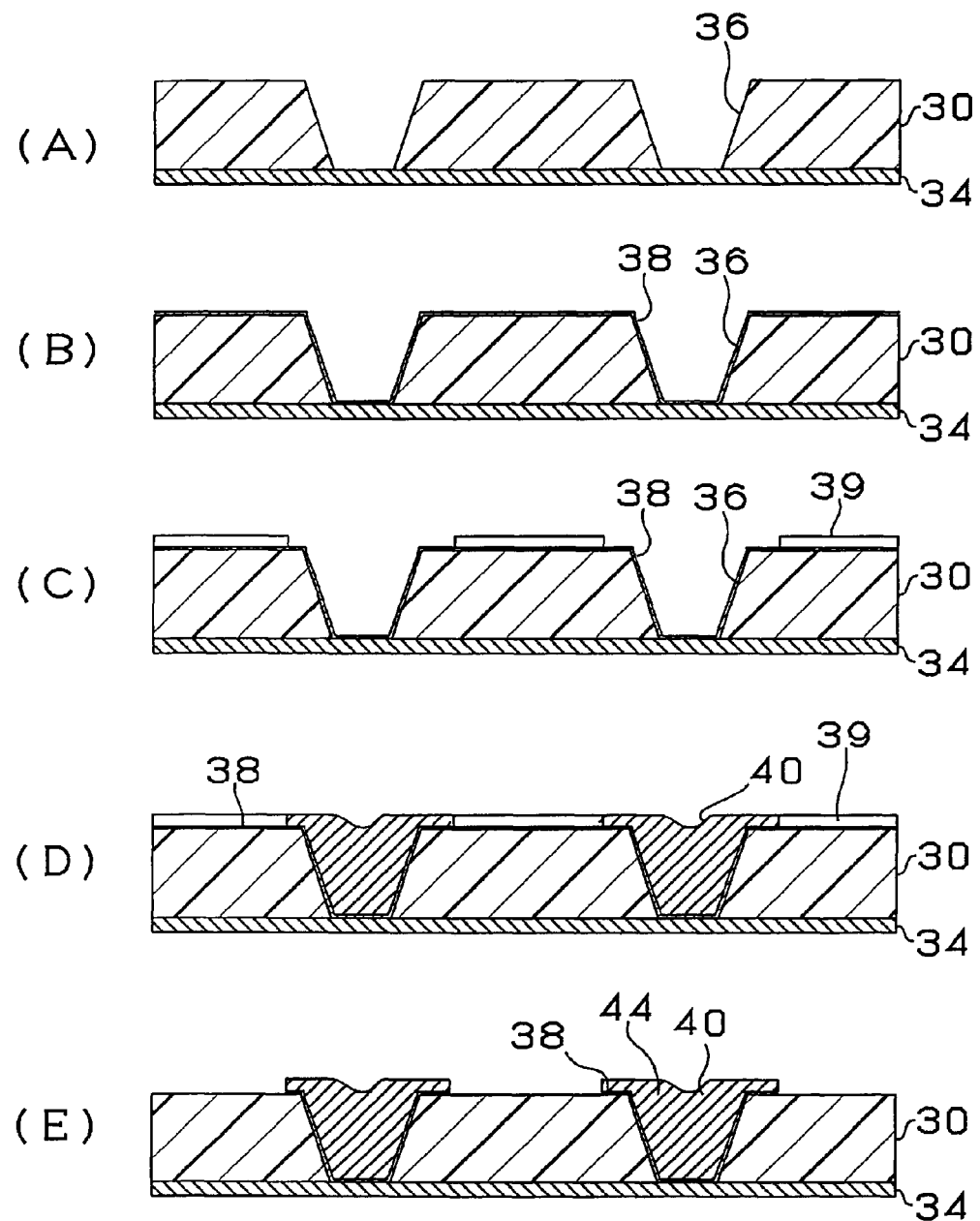
FIG. 7 are views illustrating the manufacturing steps of a flexible printed wiring board using the plating apparatus according to Example 3.

In a laminated belt substrate structured by laminating polyimide-belt substrates 30 having copper foil 34 on the back surface, via holes 36 are bored by a laser to penetrate polyimide-belt substrates 30 and to reach the back surface of copper foil 34 (FIG. 7A). Then, on the surface of belt substrate 30, chemical copper-plated film 38 is formed (FIG. 7B). After that, plated-resist layer 39 having a predetermined pattern is formed (FIG. 7C). By plating apparatus 10 described above with reference to FIG. 1, an electrolytic plating is performed to form electrolytic plated film 40 using contact body 18, made of, for example, polyvinyl-chloride woven fabric (FIG. 7D). Lastly, by peeling resist layer 39 and removing chemical copper-plated film 38 under resist layer 39, filled vias 44 are formed (FIG. 7E). In this example, a portion of the contact body performs plating while in contact at least with the surface of the resist layer (plating resist).

EXAMPLE 4

In Example 4, a multilayered printed wiring board was produced. First, the structure of the plating apparatus according to Example 4 of the present invention is described with reference to FIG. 8. In the above-described Examples 1-3, belt substrate 30A is plated. In contrast, in Example 4, printed wiring boards arranged on a sheet are plated. In Example 4, a plating apparatus 110 has a plating tank 112 filled with a plating solution 114; a circulation device 116 to circulate plating solution 114; a contact body 118 structured with insulative board 118A having a planted brush 118B, which makes contact with the plating surface of printed wiring board 30; and an elevator device 124 to move contact body 118 up and down along printed wiring board 30 by elevator pole 122.

Figure 9:
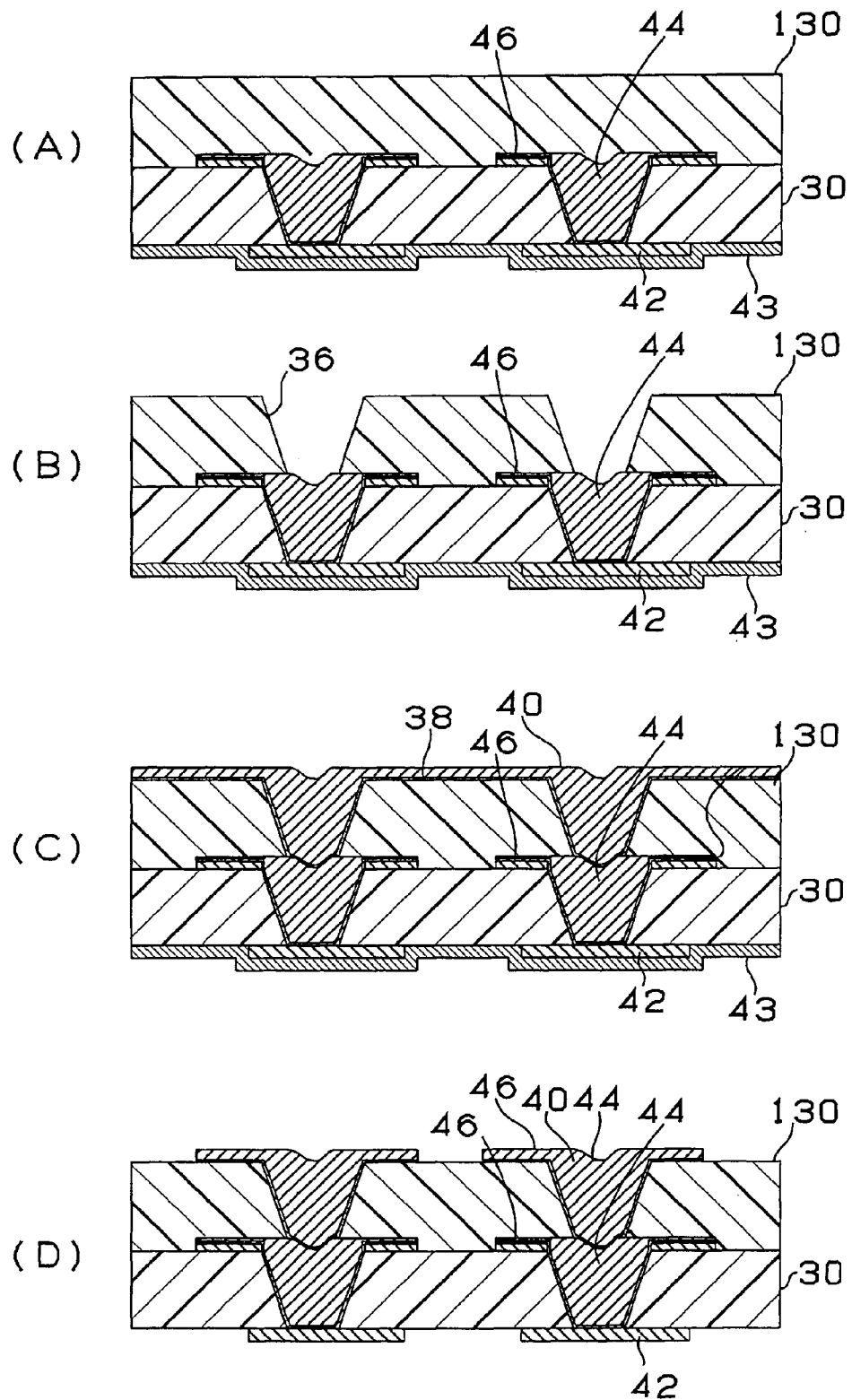
FIG. 9 are views illustrating the manufacturing steps of a multilayered printed wiring board according to Example 4.

The manufacturing steps according to Example 4 are described with reference to FIGS. 9A-9D. On the substrate in Example 1 (FIG. 3E; lower-layer substrate) where filled vias 44 are formed, a 25 μm-thick epoxy film 130 is laminated. On the surface where conductive circuit 42 made from copper foil 34 is formed, aluminum foil 43 to short-circuit each conductive circuit is laminated (FIG. 9A). Then, directly on filled vias 44, via holes 36 are formed by a laser (FIG. 9B). Then, under the same plating conditions as in Example 1, chemical copper-plated film 38 and electrolytic plated film 40 are formed on the epoxy film and inside the via holes (FIG. 9C). Aluminum foil 43 is removed, and the plated film on epoxy film 130 is patterned to form filled vias 44 and conductive circuit 46. Accordingly, a multilayered printed wiring board were obtained (FIG. 9D).

EXAMPLE 5

Figure 10:
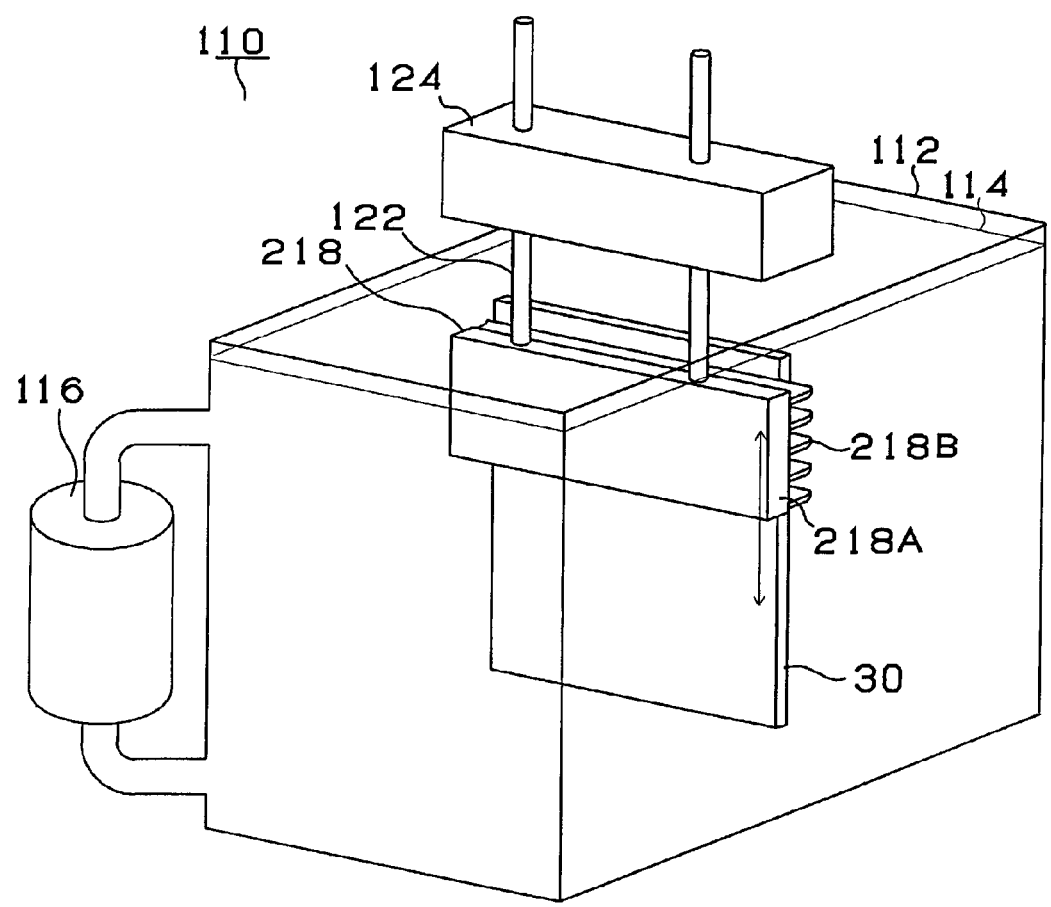
FIG. 10 is a view illustrating the plating apparatus in Example 5.
Figure 19:
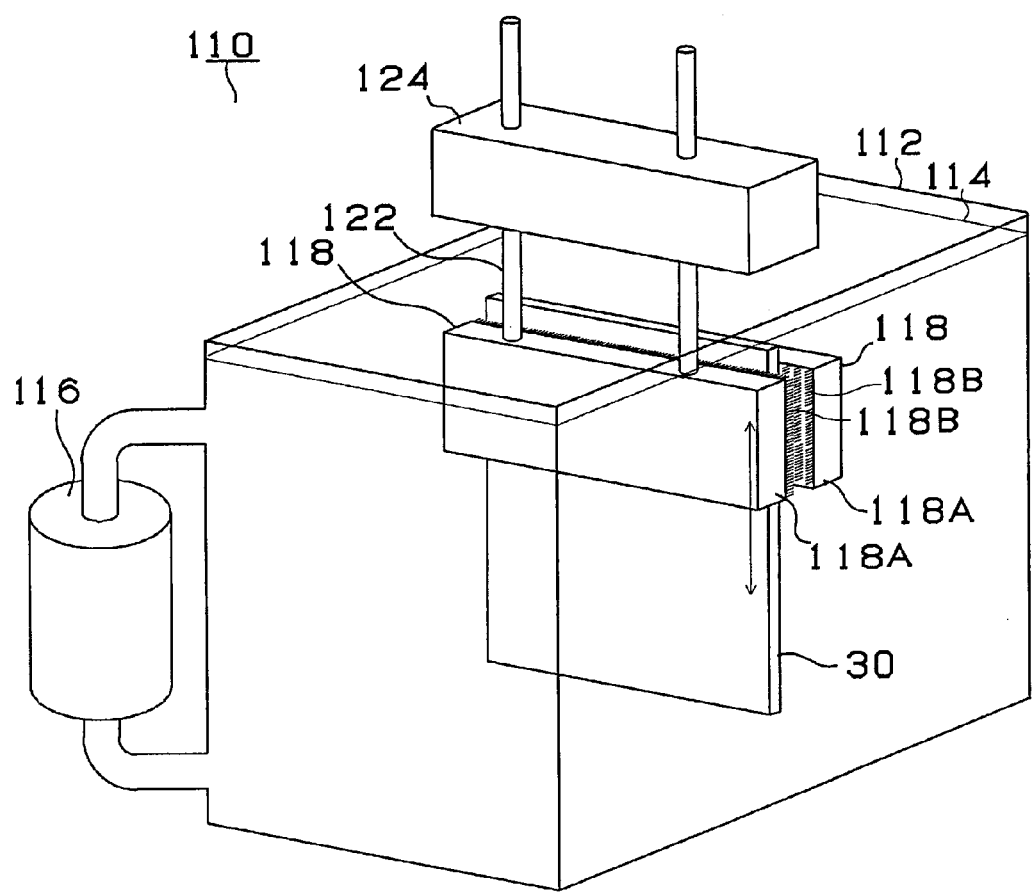
FIG. 19 is a view illustrating an altered version of the plating apparatus in Example 4.

In Example 5, a plating apparatus similar to that in Example 4 is used to form a printed wiring board. However, in Example 4, instead of the brush in Example 4, a contact body 218, structured, for example, as shown in FIG. 10 with insulation board 218A having rubber spatulas (rubber slats) 218B that make contact with the plating surface of printed wiring board 30, is used. In addition, in Example 5, an electrolytic plated film is formed without forming a chemical copper-plated film. In Examples 4 and 5, on one surface of a printed wiring board, a copper-plated film is formed. However, as shown in FIG. 19, a plating apparatus 110 structured with a pair of contact bodies 118 which sandwich printed wiring board 30 can be used.

Figure 11:
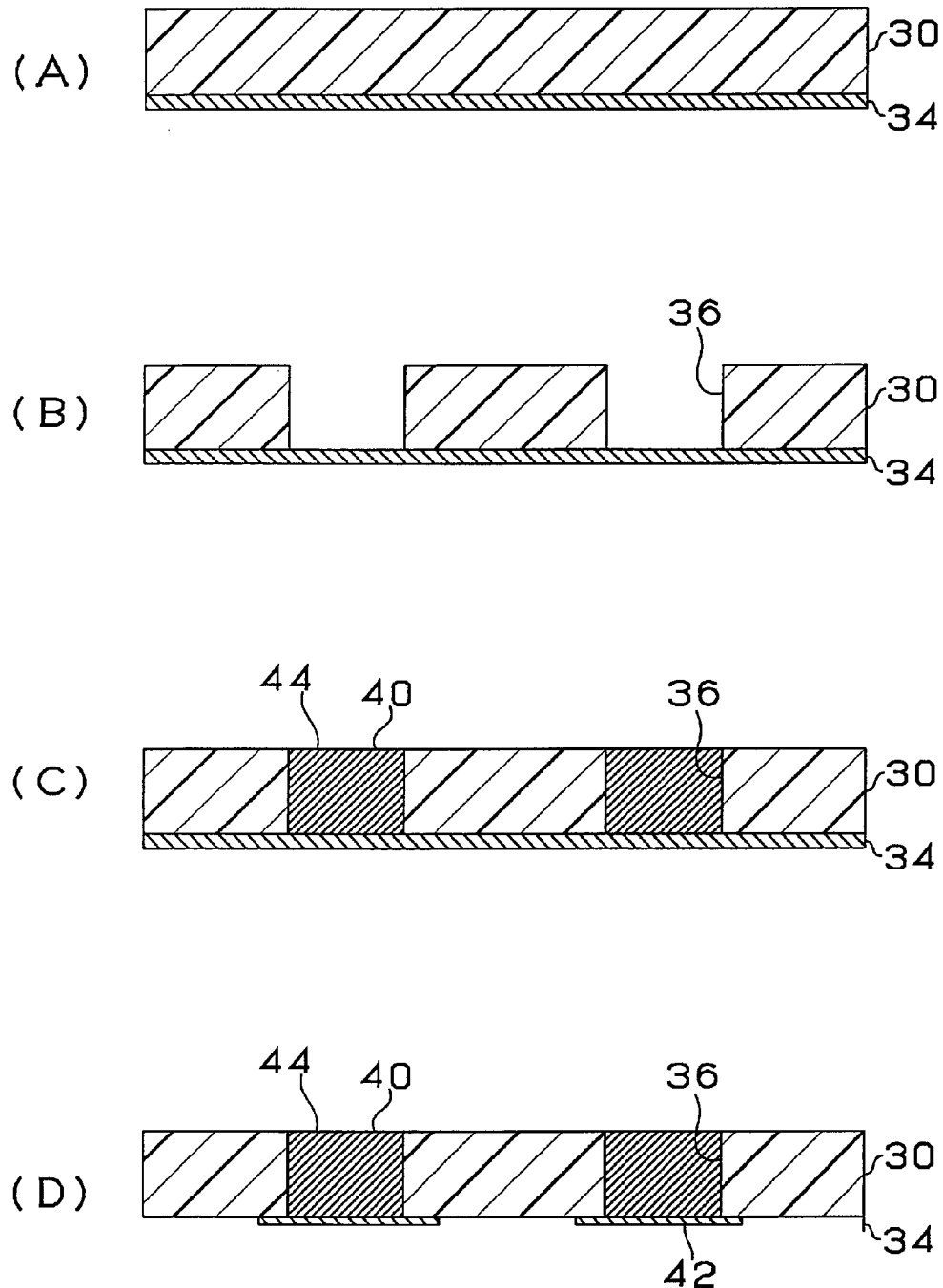
FIG. 11 are views illustrating the manufacturing steps of a printed wiring board according to Example 5.

The manufacturing method according to Example 5 is described with reference to FIGS. 11A-11D. As shown in FIG. 11A, in a laminated belt substrate structured by laminating copper foil 34 on the back surface of polyimide belt substrate 30, via holes 36 which penetrate polyimide belt substrate 30 and reach the back surface of copper foil 34 are bored by a laser (FIG. 11B). Then, using plating apparatus 10 described above with reference to FIG. 1, electrolytic plating is performed to form electrolytic plated film 40 inside via holes 36 (FIG. 11C). Lastly, copper foil 34 is etched to form conductive circuit 42 (FIG. 11D). In this example, a portion of the contact body performs plating while in contact with a portion of the surface of substrate 30 on which copper foil 34 is not laminated.

EXAMPLE 6

In Example 6, an electrolytic plated film is formed without forming a chemical copper-plated film as in Example 5. The manufacturing steps according to Example 6 are described with reference to FIGS. 12A-12D.

Figure 12:
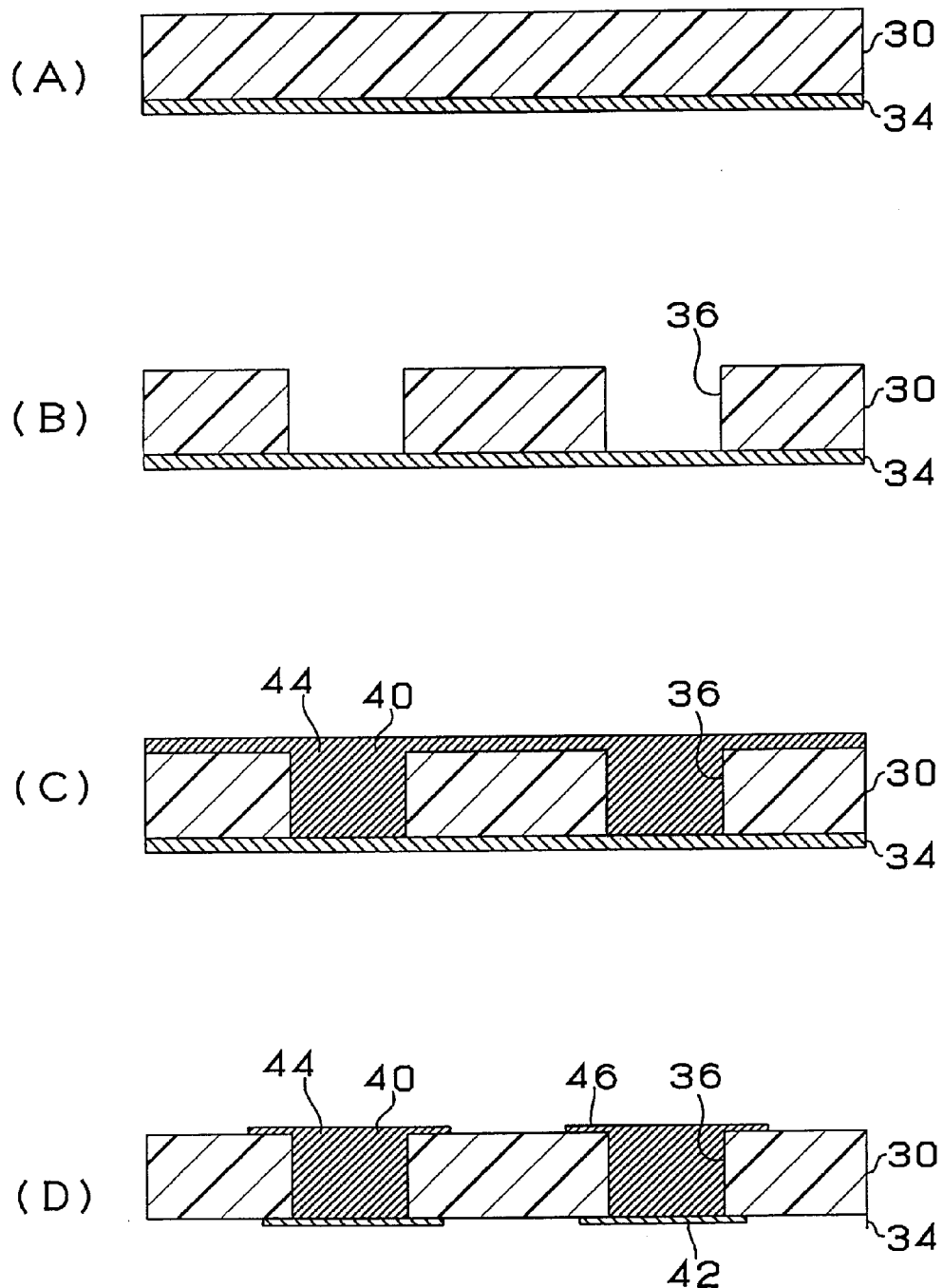
FIG. 12 are views illustrating the manufacturing steps of a printed wiring board according to Example 6.

As shown in FIG. 12A, in a laminated belt substrate structured by laminating copper foil 34 on the back surface of polyimide belt substrate 30, via holes 36 which penetrate polyimide belt substrate 30 and reach the back surface of copper foil 34 are bored by a laser (FIG. 12B). Then, using plating apparatus 10 described above with reference to FIG. 1, an electrolytic plating is performed to form electrolytic plated film 40 inside via holes 36 and on the surface of substrate 30 (FIG. 12C). Lastly, electrolytic plated film 40 on the surface of substrate 30 and copper foil 34 on the back surface are etched to form conductive circuits 46 and 42 (FIG. 12E).

Figure 8:
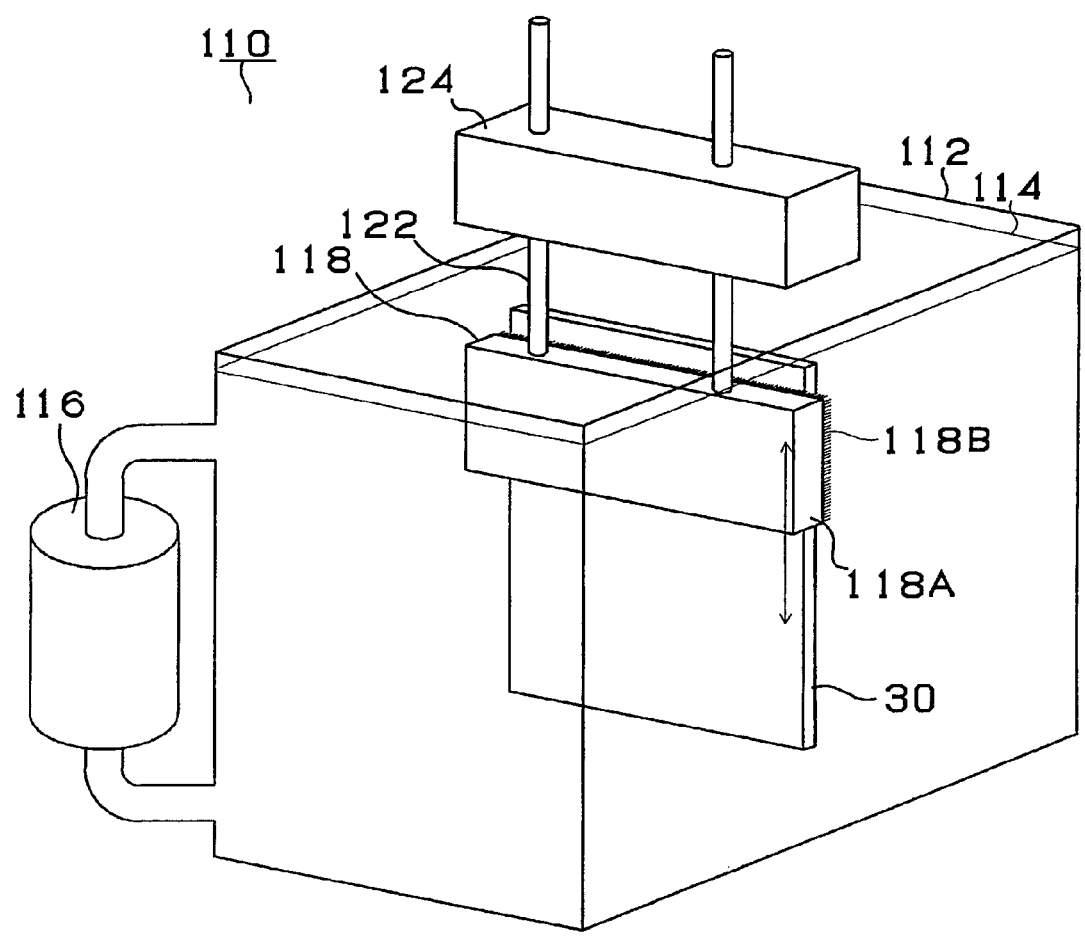
FIG. 8 is a view illustrating the plating apparatus in Example 4.

In the plating apparatuses shown in FIGS. 8 and 10, similar to the extent of indentation by a contact body, the extent of indentation by a contacting portion (e.g., brush hair) 118A or rubber spatula 218B of contact bodies 118 and 218 indicates the extent of indentation to which the tip of brush hair 118A or rubber spatula 218B is further pushed into the surface of a printed wiring board after it comes in contact with the surface. Also, contact bodies 118 and 218 are moved parallel to printed wiring board 30 in an upward or downward direction in the drawing, but they can also be moved to the left and right, or diagonally. Furthermore, by setting the rotation axis perpendicular to the printed wiring board, the contact bodies can also be rotated.

The motion speed of the contact body is preferred to be set at 1.0-8.0 m/min. If the speed is slower than 1.0 m/min., the liquid flow will not be changed, thus the result may end up the same as in a case without using a contact body. If the speed exceeds 8.0 m/min., the motion speed of the contact body is accelerated, and there may be occasions the liquid flow cannot be changed. Accordingly, the results are inferior to those obtained when the contact body is moved. The motion speed is preferred to be set in the range of 3.0-7.0 m/min. If the speed is in that range, the liquid flow can be changed even in a limited area.

The size of the contact body is preferred to be the same as or larger than the width of the plating area of the belt substrate. The extent of indentation (i.e., the extent to which the tip of the contact body is further pushed into the surface of the printed wiring board after it comes in contact with the surface) is preferred to be set at 1.0-15.0 mm from the surface of the printed wiring board. If the extent is less than 1.0 mm, the result may be the same as in a case without using a contact body. If the extent exceeds 15.0 mm, since the supply of plating solution is blocked, it may cause varied plated films in via holes and through-holes. That is because the contact body may tend to enter the via holes or through-holes. The extent of indentation is preferred to be set at 2-8 mm so that the plated films seldom vary.

Tests

In a printed wiring board having a copper foil laminated on one surface of a resin layer (in thicknesses of 30, 45, 60 or 90 μm), via-hole openings (in a hole-diameter of 40 μm, 60 μm, 80 μm or 120 μm) were formed. Then a 0.3 μm-thick chemical copper-plated film was formed on the surface of the resin layer where the via holes were formed. On the printed wiring board having the above-formed chemical copper-plated film, using the plating apparatus shown in FIG. 1, a plated film was formed inside the via-holes and on the surface of the resin layer. Then the film was patterned (see FIG. 17C). The degree of concavity or convexity (see FIG. 4B) at filled vias and the thickness of the conductive circuit (FIG. 17C) of each substrate were measured (e.g., by a laser interferometer or a microscope with a scale). The results are shown in FIG. 13A. Printed wiring boards manufactured using a conventional plating apparatus without using a contact body were prepared as comparative examples, as shown in FIG. 13B. Here, the plating conditions were adjusted so that the degree of concavity or convexity would be ±7 μm or less.

In FIG. 13A, regarding "5/−3" at the cell showing an example with a via diameter of 40 μm and an interlayer thickness of 30 μm, "5" indicates the thickness of the conductive layer formed on the resin layer (see FIG. 17C) and "−3" indicates the degree of concavity of a via (see FIG. 4B). Also, regarding "12/+7" at the cell showing an example with a via diameter of 60 μm and an interlayer thickness of 60 μm, "+7" indicates the degree of convexity of a via (see FIG. 4B). In the examples here, the degree of concavity or convexity of via holes is set at 7 μm or less. Thus, for example, as described above with reference to FIG. 9, if a multilayered printed wiring board (a multilayered printed wiring board structured by forming via conductors directly on top of filled vias) is formed, the reliability of the via-hole connection is achieved.

Evaluation Tests

As Reference Example 1, a non-pliable glass was used for the contact body. Multilayered printed wiring boards as shown in FIG. 9D were manufactured for Experimental Example 1 and Reference Example 1. In those multilayered printed wiring boards, wiring connecting 100 via-hole conductors with a hole-diameter of 60 μm (the thickness of the resin: 60 μm) was formed. The resistance values at the wirings were measured and set as initial values. Then, a heat cycle of −55° C.×5 min. ⇔ 125°×5 min. was repeated 1,000 times. After 1,000 cycles were finished, the resistance values at the wirings were measured again. If the ratio of the change in the resistance values: ((wiring resistance value after 1,000 cycles the initial wiring resistance value)/the initial wiring resistance value×100) is within 110%, it is considered as passed. The results are shown in FIG. 14. In Reference Example 1, the thin portion of the thickness of the conductive layer is assumed to be damaged.

Figure 16:
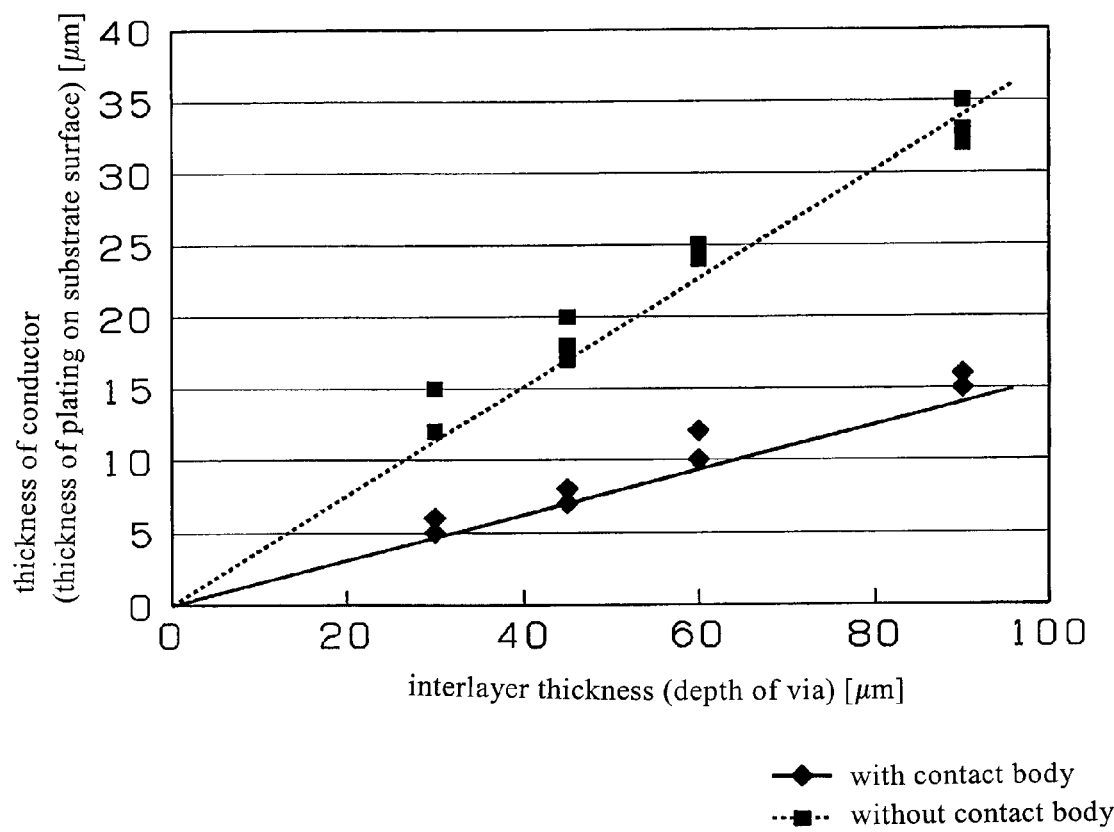
FIG. 16 is a diagram showing the thickness of conductors required to make the degree of concavity or convexity ±7 or less.

FIG. 15 shows the thickness of the conductive layer used to make the degree of concavity or convexity ±7 or less in the above-described test, and FIG. 16 shows the contents of the table in a diagram. Here, by using a contact body, the thickness of conductors (the thickness of conductive layers) may be cut substantially in half. Therefore, it is advantageous for products with finer features.

In the above-described examples, the plating apparatus in the examples of the present invention was employed in the production of via holes and through-holes. However, the plating apparatus according to the examples of the present invention can also be preferably applied to various sections of a printed wiring board. Also, in the above examples, electrolytic plating was shown, but the structure of the present invention can be practiced in chemical copper plating as well.

Numerous modifications and variations of the present invention are possible in light of the above teachings. It is, therefore, to be understood that within the scope of the accompanying claims, the invention can be practiced otherwise than as specifically described herein.

The invention claimed is:

1. A plating method for plating on a belt printed wiring board, comprising:
   contacting one or more board-shaped pliable contact bodies to the belt printed wiring board;
   moving the board-shaped pliable contact bodies up and down with respect to the printed wiring board such that respective portions of the pliable contact bodies enter into through-holes in the printed wiring board to supply a plating solution into interiors of said through-holes; and
   plating metal on a surface of the belt printed wiring board.

2. The plating method according to claim 1, wherein contacting comprises contacting a surface of the belt printed wiring board that comprises a plating surface.

3. The plating method according to claim 1, wherein contacting comprises contacting a surface of the belt printed wiring board that comprises a plating resist surface.

4. The plating method according to claim 1, wherein plating is performed while moving at least either the belt printed wiring board or the pliable contact body.

5. The plating method according to claim 1, wherein plating is performed while a surface of the pliable contact body is moved along a surface of the belt printed wiring board.

6. The plating method according to claim 1, wherein said one of the pliable contact bodies is restricted to a depth that the portion of the pliable contact body enters into the interiors of said through-holes.

7. The plating method according to claim 6, wherein said depth is 10 μm or less.

8. A plating method to perform plating in non-through-hole openings or through-hole openings of a printed wiring board having at least either non-through hole openings or through-hole openings to form via-hole conductors or through-hole conductors, comprising:
(a) contacting a printed wiring board having said non-through hole openings or said through-hole openings with a plating solution including plating ingredients;
(b) plating metal on a surface of the printed wiring board while making contact to the surface of the printed wiring board with at least a portion of a board-shaped pliable contact body; and
(c) moving the board-shaped pliable contact body up and down with respect to the printed wiring board such that said portion of the board-shaped pliable contact body enters into said non-through hole openings or said through-hole openings to supply the plating solution into interiors of said non-through hole openings or said through-hole openings.

9. The plating method according to claim 8, wherein contacting comprises contacting a surface of the printed wiring board is a plating surface.

10. The plating method according to claim 8, wherein contacting comprises contacting a surface of the printed wiring board is a plating resist surface.

11. The plating method according to claim 8, wherein plating metal comprises plating while moving at least either the printed wiring board or the pliable contact body.

12. The plating method according to claim 8, wherein plating metal comprises plating while a surface of the pliable contact body is moved along the surface of the printed wiring board.

13. The plating method according to claim 8, wherein said pliable contact body is restricted to a depth that the portion of the pliable contact body enters into the interiors of said non-through hole openings or said through-hole openings.

14. The plating method according to claim 13, wherein said depth is 10μm or less.

* * * * *